United States Patent
Bensahel et al.

(10) Patent No.: US 9,525,067 B2
(45) Date of Patent: Dec. 20, 2016

(54) METHOD FOR FORMING INTEGRATED CIRCUITS ON A STRAINED SEMICONDUCTOR SUBSTRATE

(71) Applicant: STMicroelectronics (Crolles 2) SAS, Crolles (FR)

(72) Inventors: Daniel-Camille Bensahel, Grenoble (FR); Aomar Halimaoui, Montbonnot-Saint-Martin (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 27 days.

(21) Appl. No.: 14/533,770

(22) Filed: Nov. 5, 2014

(65) Prior Publication Data

US 2015/0054141 A1 Feb. 26, 2015

Related U.S. Application Data

(62) Division of application No. 13/240,769, filed on Sep. 22, 2011, now Pat. No. 8,906,776.

(51) Int. Cl.
| | |
|---|---|
| *H01L 21/70* | (2006.01) |
| *H01L 29/78* | (2006.01) |
| *H01L 29/06* | (2006.01) |
| *H01L 29/32* | (2006.01) |
| *H01L 21/18* | (2006.01) |
| *H01L 21/3063* | (2006.01) |

(52) U.S. Cl.
CPC .......... *H01L 29/7849* (2013.01); *H01L 29/06* (2013.01); *H01L 29/32* (2013.01); *H01L 29/78* (2013.01); *H01L 21/187* (2013.01); *H01L 21/3063* (2013.01)

(58) Field of Classification Search
CPC ................................. H01L 29/32; H01L 29/06
See application file for complete search history.

(56) References Cited

U.S. PATENT DOCUMENTS

| | | | | |
|---|---|---|---|---|
| 6,878,611 B2 * | 4/2005 | Sadana | ............. | H01L 21/02381 117/90 |
| 2006/0192269 A1 * | 8/2006 | Letertre | .............. | H01L 21/2007 257/618 |
| 2006/0244105 A1 * | 11/2006 | Forbes | .............. | H01L 21/76254 257/619 |
| 2007/0111468 A1 | 5/2007 | Xie et al. | | |
| 2008/0206958 A1 | 8/2008 | Chan et al. | | |

(Continued)

FOREIGN PATENT DOCUMENTS

| | | |
|---|---|---|
| JP | 6-135798 A | 5/1994 |
| WO | 2010/010195 A2 | 1/2010 |

OTHER PUBLICATIONS

French Search Report dated Jul. 5, 2011, for French Application No. 1058377, 3 pages.

(Continued)

*Primary Examiner* — Jamie C Niesz
(74) *Attorney, Agent, or Firm* — Seed IP Law Group LLP

(57) ABSTRACT

An electronic circuit on a strained semiconductor substrate, includes: electronic components on a first surface of a semiconductor substrate; and at least portions of a layer of a porous semiconductor material on the side of a second surface of the semiconductor substrate, opposite to the first surface, to bend the semiconductor substrate.

12 Claims, 4 Drawing Sheets

(56) References Cited

U.S. PATENT DOCUMENTS

2010/0044838 A1* 2/2010 Mauder .................. H01L 21/78
257/620

OTHER PUBLICATIONS

Marty, "Straining of monocrystalline silicon thin films with the use of porous silicon as stress generating nanomaterial," *Applied Physics Letters 88*, 2006, 3 pages.
Written Opinion dated Oct. 14, 2010, for French Application No. 1058377, 4 pages.
Currie, M. T. et al., "Carrier mobilities and process stability of strained Si *n*- and *p*-MOSFETs on SiGe virtual substrates," J. Vac. Sci. Technol. B 19(6):2268-2279, Nov./Dec. 2001.

* cited by examiner

METHOD FOR FORMING INTEGRATED CIRCUITS ON A STRAINED SEMICONDUCTOR SUBSTRATE

CROSS REFERENCE TO RELATED APPLICATIONS

This application claims the priority benefit of French patent application number 10/58377, filed on Oct. 14, 2010, entitled METHOD FOR FORMING INTEGRATED CIRCUITS ON A STRAINED SEMICONDUCTOR SUBSTRATE, which is hereby incorporated by reference to the maximum extent allowable by law.

BACKGROUND OF THE INVENTION

1. Field of the Invention

The present invention relates to a method for forming integrated circuits on a strained semiconductor substrate. More specifically, the present invention relates to a method in which the semiconductor substrate undergoes a biaxial strain.

2. Discussion of the Related Art

Integrated electronic components are generally formed on wafers, further called supports or substrates, made of semiconductor materials. Such materials allow the displacement of carriers, electrons and holes, enabling electronic components to operate properly. MOS transistors having a structure comprising a channel in which electrons or holes travel can be mentioned as an example of electronic components implying the displacement of carriers.

Many methods have been provided to improve the mobility of carriers in semiconductor substrates. In particular, the mobility of electrons is known to be relatively good in a silicon substrate, while that of holes is optimized in a silicon-germanium substrate.

The mobility of carriers is also known to be improvable by modifying the crystallographic structure of a semiconductor substrate, by applying a compressive or tensile strain thereto. In particular, applying a single-axis compressive strain improves the mobility of holes in a semiconductor substrate. The application of a single-axis tensile strain improves the mobility of electrons.

In the case of MOS transistors, it has been provided to apply a strain to the transistor channel by replacing the material of the source and drain regions with a material capable of straining the adjacent channel. Strained regions located at the level of the transistor channels are thus obtained.

The application of a biaxial strain, that is, a strain along the two surface dimensions of a substrate, formed for example from the two sides of a MOS transistor channel, is also known to improve the mobility of electrons by approximately 80% and that of holes on the order of 60%. This is described in publication "Carrier mobilities and process stability of strained Si n- and p-MOSFETs on SiGe virtual substrates", by M. T. Currie et al., J. Vac. SCI. Technol. B 19 (6), November/December 2001, pp. 2268-2279, which discloses the use of a relaxed silicon-germanium substrate enabling to apply a biaxial tensile strain in a silicon film.

Known methods enabling to form uniaxially strained substrates have the disadvantage of being relatively complex to implement since they necessitate the forming of two different materials for N-channel and P-channel MOS transistors. Further, the improvement of the carrier mobility in such substrates depends on the transistor size. Known methods enabling to form biaxially strained substrates have the disadvantage of forming strained layers in which the density of faults (dislocations) is very high.

Thus, there is a need for a method of application of a uniform biaxial strain over the entire surface of a semiconductor substrate which is relatively easy to implement and which overcomes all or part of the above disadvantages.

SUMMARY OF THE INVENTION

An embodiment provides a method for forming a tensilely or compressively strained semiconductor wafer, in which the strain is uniform and biaxial.

An embodiment provides a method which is relatively easy to implement.

An embodiment provides a method for forming an electronic circuit on a strained semiconductor substrate, comprising the steps of: forming, on a first surface of a semiconductor substrate, electronic components defining electronic chips to be sawn; and forming at least portions of a layer of a porous semiconductor material on the side of a second surface of the semiconductor substrate, opposite to the first surface, to bend the semiconductor substrate.

According to an embodiment, the portions of porous semiconductor material layer have a thickness ranging between 75 and 125 µm.

According to an embodiment, the method is capable of forming a tensilely strained semiconductor substrate and further comprises the steps of: performing a first anneal at a temperature ranging between 425 and 475° C., for a time period shorter than 10 minutes, under a non-oxidizing atmosphere; and performing a second anneal at a temperature ranging between 250 and 350° C., in oxygen, for a time period ranging between 45 and 75 minutes.

According to an embodiment, the forming of the portions of porous semiconductor material on the second surface of the semiconductor substrate is obtained by carrying out the steps of: forming, on a semiconductor support, portions of a porous semiconductor material; applying a processing capable of planarizing the semiconductor support; and gluing the semiconductor support to the second surface of the semiconductor substrate.

According to an embodiment, the processing capable of planarizing the semiconductor support is an anneal at a temperature ranging between 430 and 480° C. in a non-oxidizing atmosphere for a time period shorter than 10 minutes.

According to an embodiment, the method is capable of forming a compressively strained semiconductor substrate and further comprises a step of placing the porous semiconductor material in a hydrofluoric acid bath after gluing.

According to an embodiment, the method is capable of forming a tensilely strained semiconductor substrate and further comprises a step of annealing the device at a temperature ranging between 250 and 350° C. in oxygen, for a time period ranging between 45 and 75 minutes, after gluing.

According to an embodiment, the portions of porous semiconductor material are formed on the entire second surface of the semiconductor substrate.

According to an embodiment, the gluing of the semiconductor support on the second surface of the semiconductor substrate is performed on the side opposite to the portions of porous semiconductor material.

According to an embodiment, the gluing of the semiconductor support on the second surface of the semiconductor substrate is performed on the side comprising the portions of porous semiconductor material.

The foregoing and other objects, features, and advantages of the present invention will be discussed in detail in the following non-limiting description of specific embodiments in connection with the accompanying drawings.

BRIEF DESCRIPTION OF THE DRAWINGS

For clarity, the same elements have been designated with the same reference numerals in the different drawings and, further, as usual in the representation of integrated circuits, the various drawings are not to scale.

DETAILED DESCRIPTION

FIGS. 1 to 4 illustrate results of steps of a method that enables applying a tensile or compressive strain on a semiconductor substrate on which electronic components are formed.

Figure 1:
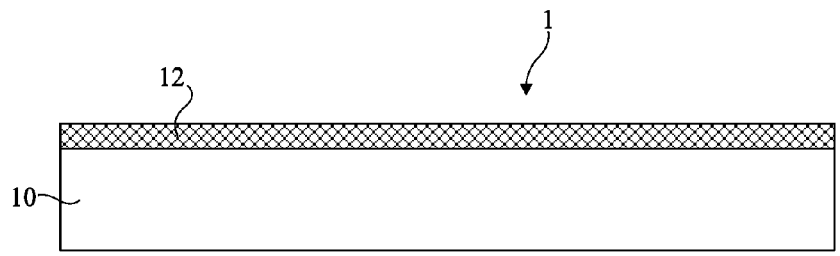
FIGS. 1 to 4 illustrate the results of steps of a method for forming an integrated circuit.

At the step illustrated in FIG. 1, it is started from a device 1 comprising a semiconductor substrate 10 at the surface of which are formed electronic components 12, not shown in detail. In the following description, a silicon substrate 10 will be considered, as a non-limiting example. Preferably, substrate 10 is thinned before carrying out the next step of the method and for example has a thickness ranging between 100 and 200 µm.

Electronic components 12 may be integrated components directly formed on the semiconductor substrate, electronic chips placed on the substrate, or any other type of component. Electronic components 12 may be completely formed, for example, with their upper interconnection levels and/or their upper protection layer (encapsulation). In this case, the integrated circuits are ready to be sawn into individual chips. Electronic components 12 may also be almost completed, that is, a small number of steps, for example of forming of an upper protection layer, are sufficient to obtain, after sawing, completed individual electronic chips.

Figure 2:
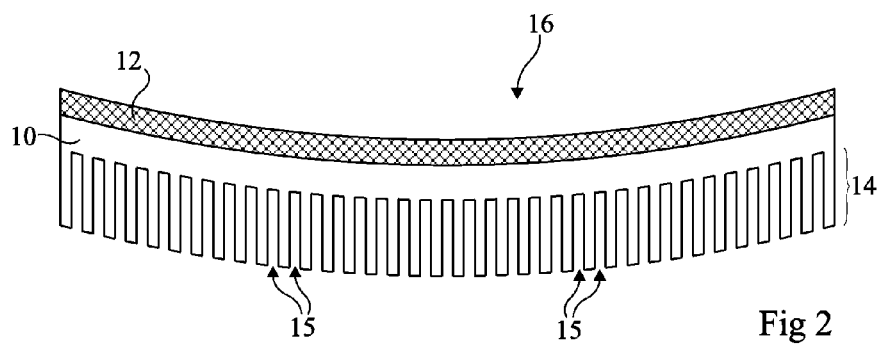

At the step illustrated in FIG. 2, a layer 14 of porous silicon with pores 15 has been formed on the lower surface of substrate 10, that is, on the surface opposite to that on which electronic components 12 are formed, to obtain a device 16. For example, porous silicon 14 may be formed by electrolysis in the presence of an acid solution. Conventionally, pores 15 of porous silicon 14 extend as a majority in a vertical direction (penetrating widthwise into the structure), and are shown in the drawings as thin vertical trenches.

To form porous silicon layer 14 by electrolysis, the electric contacts present on the upper surface of substrate 10 (front surface), which are for example provided in the last interconnection level, may be used. Further, device 1 may be maintained, during the electrolysis, in different ways, and especially by using a suck-in system on the side of the front surface of device 1 or by using a system comprising an O-ring capable of maintaining this front surface in the electrolysis equipment.

As illustrated in FIG. 2, the present inventors have found that, if no specific precautions are taken, the forming of porous silicon layer 14 tends to bend the entire wafer to make its upper surface concave, which necessitates that the upper portion of substrate 10 in which components 12 are formed is compressively strained. It should be noted that the curvature shown in the drawings is amplified with respect to reality, for clarity. Device 16 of FIG. 2 is in reality very slightly bent in two directions defining a plane tangent to the surface of device 16, which corresponds to a uniform biaxial strain capable of improving the mobility of the different carriers.

The compressive strain in the case of FIG. 2 may be controlled to accurately modify the mobility of the carriers by a desired quantity. For this purpose, the thickness of porous silicon layer 14 or the porosity of layer 14 may be varied. As an example, porous silicon layer 14 may have a thickness ranging between 75 and 125 µm, for example, 100 µm, the porosity rate may range between 45 and 65%, for example, 50%, and the diameter of pores 15 may range between 2 and 10 nm, for example, 3 nm.

The device obtained in FIG. 2 is a device 16 in which semiconductor substrate 10 is compressively strained, the strain being biaxial and uniform (the center of curvature of the device is located on the side opposite to the porous silicon), which improves, in the case of a silicon substrate, the mobility of P-type carriers (approximately 80%) and of N-type carriers (approximately 60%).

Figure 3:
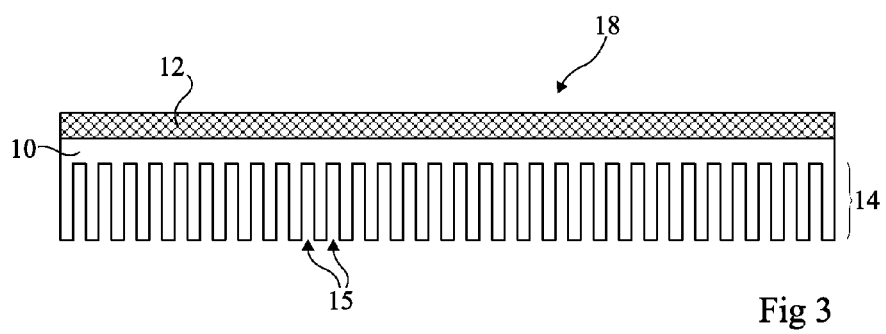

At the step illustrated in FIG. 3, the structure of device 16 has been rectified to obtain a planar device 18. To achieve this, device 16 is annealed under a non-oxidizing atmosphere (for example, in vacuum, under a nitrogen atmosphere . . . ). This anneal may for example be carried out at a temperature ranging between 425 and 475° C., preferably at 450° C., for example, for a time period shorter than 10 minutes, preferably for 5 minutes. This anneal enables to remove part of the hydrogen present in pores 15 of porous silicon 14 and thus to reduce or remove the strain that the porous silicon transmits to non-porous silicon portion 10.

Figure 4:
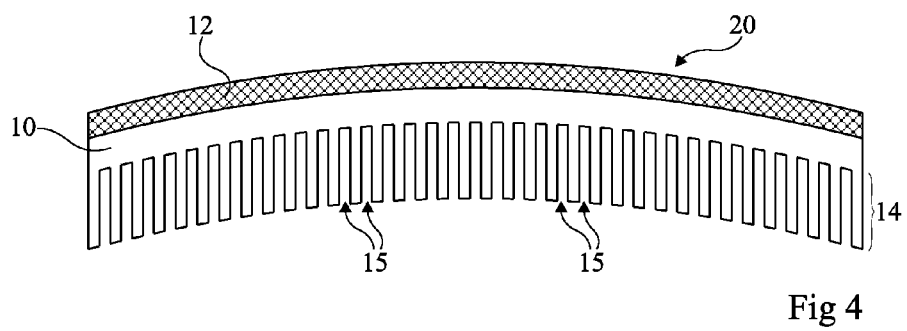

At the step illustrated in FIG. 4, a second anneal of device 18 has been performed in oxygen. As an example, this anneal may be carried out at a temperature ranging between 250 and 350° C., for example, at 300° C., for a time period ranging between 45 and 75 minutes, for example, 60 minutes. This anneal in oxygen provides a device 20 in which substrate 10 is bent in a direction opposite to that of device 16, substrate 10 being thus tensilely strained.

Electronic components 12 formed at the surface of a tensilely strained substrate are thus obtained, the strain being biaxial and uniform. This improves the mobility of carriers. For example, in the case of a silicon substrate tensilely strained according to a biaxial strain, an improved mobility of N-type carriers on the order of 80% and an improved mobility of P-type carriers on the order of 60% are obtained.

The method described in relation with FIGS. 1 to 4 is adapted to the case of electronic components 12 formed on a solid substrate 10. However, this method cannot apply in the case of a substrate 10 of semiconductor on insulator type (SOI). Indeed, to form a porous silicon layer, the electrolysis requires the flowing of a current between the two surfaces of the device. It is thus difficult to perform an electrolysis in the case where an insulating layer is interposed between the upper semiconductor substrate and a lower support.

FIGS. 5A, 5B, 6, and 7 illustrate steps of an alternative embodiment adapted to such cases. It should be noted that this variation also applies to the case of a solid substrate.

Figure 5A:
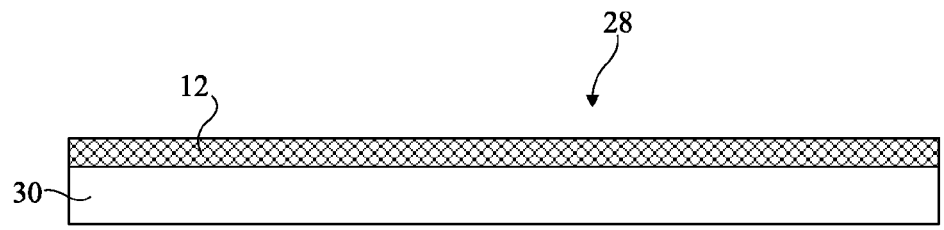
FIGS. 5A, 5B, and 6 to 8 illustrate results of steps of a variation of the method.
Figure 5B:
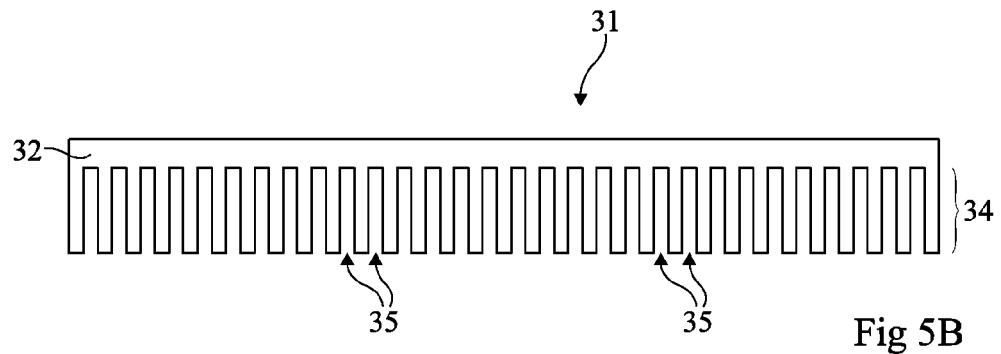

FIGS. 5A and 5B illustrate results of a step preliminary to the forming of electronic components on a strained substrate.

In FIG. 5A, it is started from a device 28 comprising a semiconductor substrate 30 at the surface of which are formed electronic components 12, not shown in detail. As in the case of FIG. 1, substrate 30 is thinned, and may be ready or almost ready to be sawn (electronic components 12 encapsulated or not). Device 28 is thus almost ready to be sawn to form individual electronic chips.

As shown in FIG. 5B (device 31), a second thinned semiconductor substrate 32, for example, a silicon substrate having a thickness ranging between 100 and 300 µm, is transformed so that its lower surface 34 is made of porous silicon, across a thickness ranging between 75 and 125 µm, for example, 100 µm.

Porous silicon layer 34 comprises pores 35, mainly vertical, and may be formed by electrolysis in the presence of an acid solution according to a conventional method. Semiconductor substrate 32 is planar. To obtain such a structure, a porous silicon layer is formed on the rear surface of substrate 32, which modifies the curvature of the substrate, as seen in relation with FIG. 2. The obtained device 31 is then submitted to a processing enabling to make it planar, for example, an anneal in a non-oxidizing atmosphere (for example, in vacuum, in a nitrogen atmosphere . . . ), carried out at a temperature ranging between 425 and 475° C., preferably at 450° C., for a time period shorter than 10 minutes, preferably for 5 minutes.

Figure 6:
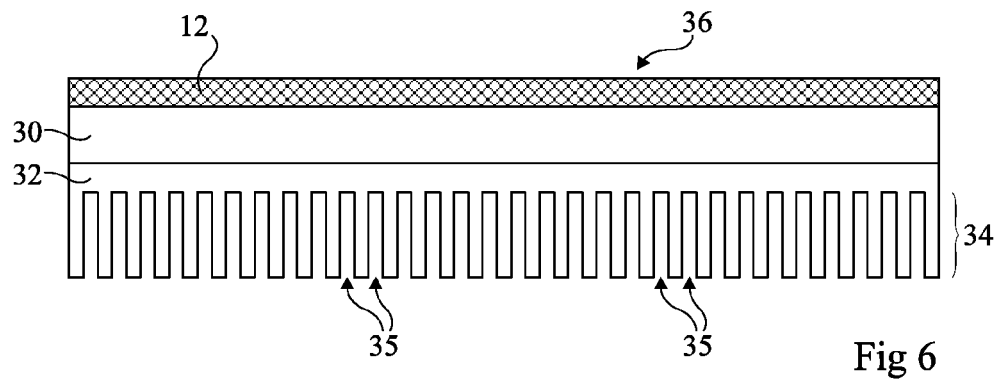

FIG. 6 illustrates the result of a subsequent step of gluing of substrates 30 and 32 to obtain a device 36. The gluing may be performed by any known method, for example, by molecular bonding. In the following example, substrate 32 is glued to substrate 30 via its upper surface, that is, via its solid semiconductor material surface, not transformed into porous silicon 34. A device formed of the superposition of the devices shown in FIGS. 5A and 5B is thus obtained.

Figure 7:
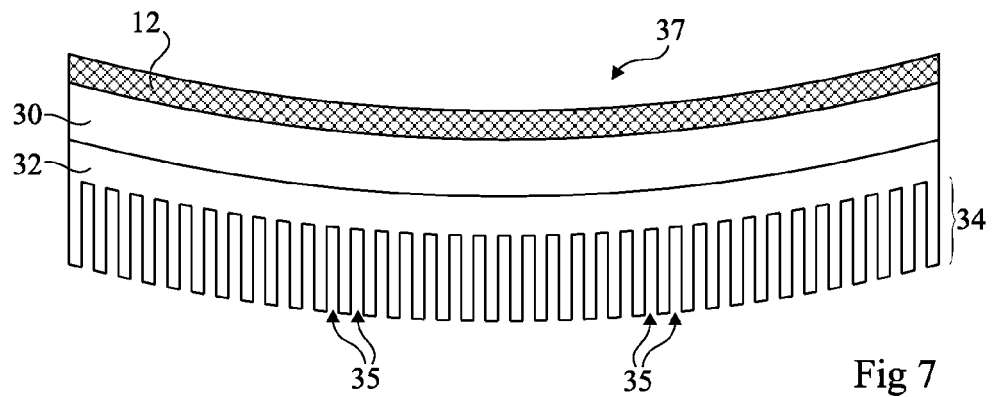
Figure 8:
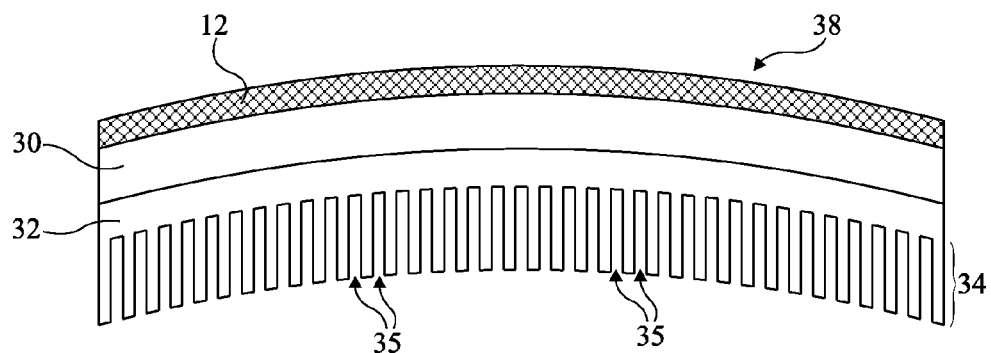

FIGS. 7 and 8 illustrate two variations formed from device 36 obtained after gluing of the devices of FIGS. 5A and 5B.

In the case of FIG. 7, a processing has been applied to the porous silicon layer so that its lower surface bends and becomes convex, and that this curvature is transmitted to substrate 30. A device 37 in which the upper portion of substrate 30, which supports electronic components 12, is compressively strained, is obtained.

To obtain device 37, device 36, or at least porous silicon layer 34, is immersed in a hydrofluoric acid solution (HF). This results in covering the porous silicon pores with hydrogen. Thus, porous silicon 34 bends and a compressive strain is transmitted to silicon substrate 30.

In the case of FIG. 8, a different processing has been applied to device 36 of FIG. 6 to obtain a device 38 in which the semiconductor substrate 30 undergoes a tensile strain. To obtain this device, an anneal such as that described in relation with FIG. 4 may be performed, for example, an anneal performed at 300° C. for approximately one hour and in oxygen.

This results in modifying the structure of porous silicon layer 34, by desorption of the hydrogen atoms of pores 35 of the porous silicon, and thus to bend in convex fashion the upper surface of substrate 32. Due to the gluing of substrate 30 on substrate 32, the tensile strain is transmitted to substrate 30 and said substrate is also tensed.

Thus, according to the processing applied to device 36 obtained at the step of FIG. 6, an electronic circuit formed on a biaxially and uniformly tensilely or compressively strained substrate is obtained.

Figure 9:
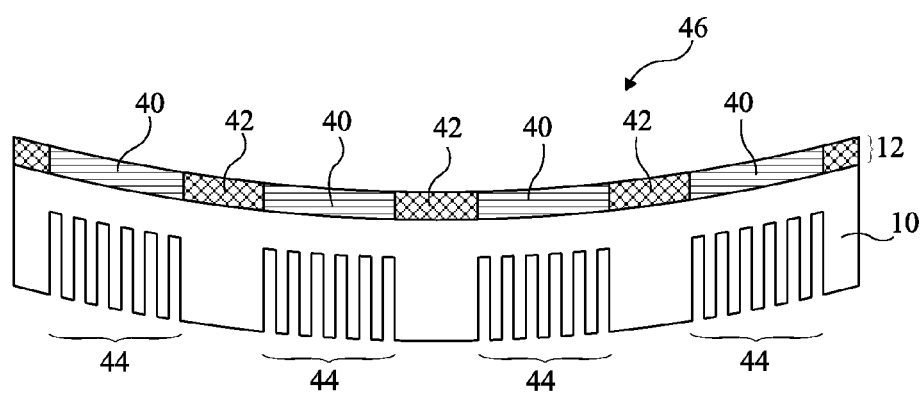
FIGS. 9 to 10 illustrate two results of a variation of the method.
Figure 10:
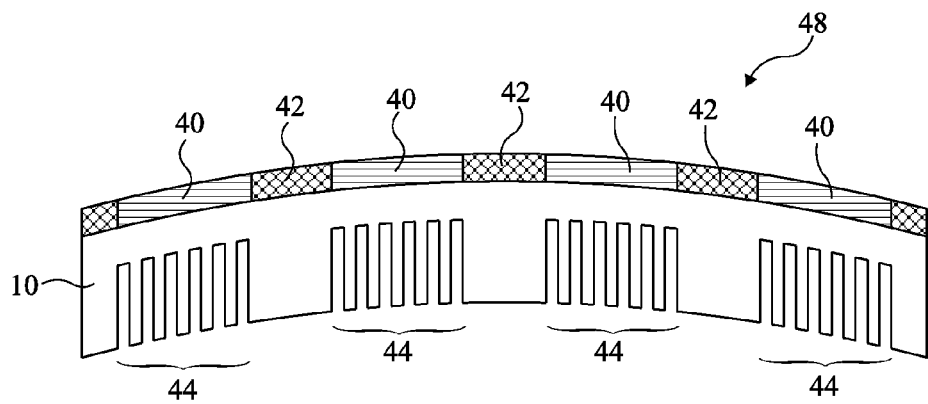

FIGS. 9 and 10 illustrate two alternative embodiments respectively corresponding to results of steps similar to those of FIGS. 2 and 4.

In these two embodiments, layer 12 comprising the electronic components is shown in further detail, and comprises first regions 40 in which the electronic components of electronic chips are formed and second regions 42 corresponding to areas of sawing of the electronic chips into individual chips.

In these two alternative embodiments, substrate 10 comprises porous silicon portions 44 in front of electronic chip areas 40 only. To obtain porous silicon portions distributed on semiconductor wafer 10, it may for example, before the electrolysis forming the porous silicon, be provided to form insulating regions, on the lower surface of substrate 10, in front of sawing areas 42.

The variation of FIGS. 9 and 10 provides a strain, compressive in the example of device 46 of FIG. 9 and tensile in the example of device 48 of FIG. 10, equivalent to that respectively obtained in the devices of FIGS. 2 and 4, while keeping relatively dense (non porous) individual electronic chips adapted to currently-used sawing methods.

It should be noted that once the device comprising a tensilely or compressively strained substrate has been obtained, to saw the device into individual electronic chips, it may be provided to form, on one of the two surfaces of the device, a resin layer to planarize the structure and make the sawing easier.

Figure 11:
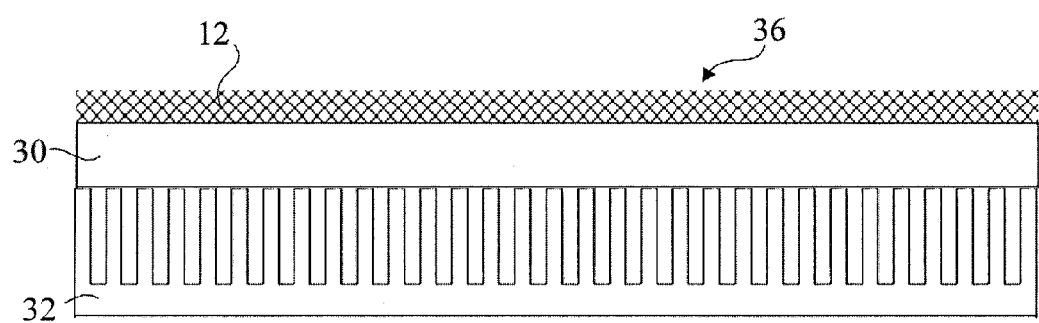
FIG. 11 illustrates a result of another variation of the method.

Specific embodiments of the present invention have been described. Various alterations and modifications will occur to those skilled in the art. In particular, in the case of the variation described in relation with FIGS. 5A, 5B, and 6 to 8, a gluing between the devices of FIGS. 5A and 5B, not on upper solid surface 32 of the structure of FIG. 5B but on the lower side of this structure, that is, on porous silicon layer 34, may be provided, as depicted in FIG. 11. To carry out the steps enabling to apply a strain on such a structure, a planarization step will be provided to expose, on the lower portion of the structure, porous silicon layer 34. This variation has the advantage of providing a relatively thin final structure.

Further, a device comprising a silicon semiconductor substrate 10, 32 has been described herein. It should be noted that substrate 10, 32 may also be made of any material capable of being transformed at its surface into a porous material. Silicon-germanium or germanium may in particular be used.

Further, as a variation, it may also be provided to saw the device into individual chips directly from the structure of FIG. 3 or 6. The processing enabling to form a bent porous material layer which transmits its strain to the upper portion of the device may then be performed on the sawn individual chips.

In the case where substrate 10, 32 is made of silicon, a P-type doped substrate having a majority-carrier concentration ranging between $5.10^{14}$ and $5.10^{19}$ atoms/cm$^3$ will preferably be used.

As an example, to obtain a porous silicon with a porosity on the order of 50%, well adapted to the subsequent transformation steps enabling to bend the device, an electrolysis may be performed by using, for a P-type substrate (doping of $10^{15}$ atoms/cm$^3$), a current on the order of 10 mA/cm$^2$ in a hydrofluoric acid having a concentration greater than 35%. It should be noted that the ethanol currently used in the hydrofluoric acid solution may also be replaced with acetic acid to decrease the porosity of the porous silicon to a proportion smaller than 50% and thus increase the curvature of the obtained device. The use of acetic acid also enables to use high current densities (greater than 100 mA/cm$^2$), thus decreasing the anodization time.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A strained integrated device structure comprising:
   integrated devices formed at a first surface of a semiconductor substrate;
   a semiconductor support including a first surface, a second surface, porous semiconductor material formed at the first surface of the semiconductor support, and a region of nonporous semiconductor material positioned within the semiconductor support and between the porous semiconductor material and a bottom of the integrated devices, wherein the semiconductor support is bonded to a second surface of the semiconductor substrate and the semiconductor substrate includes a region of strained semiconductor located between the porous semiconductor material and the integrated devices,
   wherein the porous semiconductor material is formed as a plurality of islands separated by regions of non-porous semiconductor material.

2. The strained integrated device structure of claim 1, wherein a second surface of the semiconductor support is bonded to the second surface of the semiconductor substrate.

3. The strained integrated device structure of claim 1, wherein the porous semiconductor material has a thickness ranging between 75 microns and 125 microns.

4. The strained integrated device structure of claim 1, wherein the semiconductor support has a thickness ranging between 100 microns and 200 microns.

5. The strained integrated device structure of claim 1, wherein the integrated devices are encapsulated.

6. The strained integrated device structure of claim 1, wherein the region of nonporous semiconductor material is positioned at the second surface of the semiconductor support, the second surface of the semiconductor support being bonded to the second surface of the semiconductor substrate.

7. A strained integrated device structure comprising:
   a semiconductor support including a first surface and porous semiconductor material at the first surface;
   a semiconductor substrate bonded to the semiconductor support and having a first surface and a second surface; and
   an integrated device formed at the first surface of the semiconductor substrate, wherein:
   the semiconductor substrate includes a region of strained semiconductor located between the porous semiconductor material and the integrated device,
   the semiconductor support includes a region of nonporous semiconductor material positioned in the semiconductor support and between the porous semiconductor material and a bottom of the integrated device, and
   the porous semiconductor material is formed as a plurality of islands separated by regions of non-porous semiconductor material.

8. The strained integrated device structure of claim 7, wherein a second surface of the semiconductor support is bonded to the second surface of the semiconductor substrate.

9. The strained integrated device structure of claim 7, wherein the porous semiconductor material has a thickness ranging between 75 microns and 125 microns.

10. The strained integrated device structure of claim 7, wherein the semiconductor support has a thickness ranging between 100 microns and 200 microns.

11. The strained integrated device structure of claim 7, wherein the integrated device is encapsulated.

12. The strained integrated device structure of claim 7, wherein the region of nonporous semiconductor material is positioned at a second surface of the semiconductor support, the second surface of the semiconductor support being bonded to the second surface of the semiconductor substrate.

* * * * *